(12) United States Patent
Radu et al.

(10) Patent No.: US 6,573,590 B1
(45) Date of Patent: Jun. 3, 2003

(54) INTEGRATED CIRCUIT PACKAGE WITH EMI CONTAINMENT FEATURES

(75) Inventors: Sergiu Radu, Fremont, CA (US); John E. Will, Pleasanton, CA (US); Steven Boyle, Santa Clara, CA (US); David Hockanson, Boulder Creek, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/074,721

(22) Filed: Feb. 11, 2002

(51) Int. Cl.[7] .............................................. H01L 23/552
(52) U.S. Cl. ........................................ 257/660; 257/659
(58) Field of Search ................................. 257/659, 660

(56) References Cited

U.S. PATENT DOCUMENTS 5,166,772 A * 11/1992 Soldner et al. ........... 174/35 R
5,561,265 A * 10/1996 Livshits et al. ......... 174/35 GC
5,639,989 A *  6/1997 Higgins, III ........... 174/35 MS

* cited by examiner

*Primary Examiner*—Allan R. Wilson
(74) *Attorney, Agent, or Firm*—Meyertons Hood Kivlin Kowert & Goetzel, P.C.; B. Noël Kivlin

(57) ABSTRACT

An integrated circuit package comprising EMI containment features. The EMI containment features include a first EMI containment configuration and a second EMI containment configuration. The second EMI containment configuration is disposed around the first EMI containment configuration. The first and second EMI containment configurations include vias coupled to at least one ground plane of the integrated circuit package.

18 Claims, 3 Drawing Sheets

INTEGRATED CIRCUIT PACKAGE WITH EMI CONTAINMENT FEATURES

BACKGROUND OF THE INVENTION

1. Field of the Invention

The present invention relates generally to integrated circuit (IC) packages, and more specifically to containing electromagnetic interference (EMI) generated by integrated circuits.

2. Background Information

Many integrated circuits generate undesirable amounts of EMI. Typically, the "noise" generated by the integrated circuit originates from the die and its connections to the pins through the package, and is coupled to the heatspreader or lid covering the die and then to the heatsink, which acts as an antenna that further radiates the EMI. As the EMI is coupled to neighboring components and integrated circuits, it interferes with their individual performance which may, in turn, affect the overall performance of a system. Because of the negative effects of EMI and because the level of acceptable radiated EMI is subject to strict regulatory limits, it is desirable to contain or suppress the EMI generated by an integrated circuit.

Some solutions take place at the printed circuit board (PCB) level. For example, one solution involves grounding the heatsink to build a Faraday cage around the EMI producing chip (e.g., a CPU). This solution typically involves the use of a grounded gasket which surrounds the chip and makes contact with the heatsink. However, the effectiveness of this solution is dependent on having good contact between the gasket and the heatsink and between the heatsink and the chip lid. Because of the gasket contacts with ground on the top layer of the PCB, the routing of the pin escapes on the top layer may be very difficult or even impossible. In such a situation, the PCB may need additional layers which increases the cost of the PCB. Furthermore, the gasket itself represents an additional cost and potential point of failure, as it is a separate part that must be added to the PCB.

EMI solutions at the IC package level are often ignored because the main concerns at that level are signal integrity and functionality. It would be beneficial to have an EMI solution at the package level because it would help reduce the need for "downstream" or add-on solutions.

SUMMARY OF THE INVENTION

An apparatus comprises an integrated circuit package comprising a first EMI containment configuration and a second EMI containment configuration disposed around the first EMI containment configuration. The first and second EMI containment configurations are grounded by at least one ground plane of the package.

Additional features and benefits of the present invention will become apparent from the detailed description, figures and claims set forth below.

BRIEF DESCRIPTION OF THE DRAWINGS

Various embodiments of the present invention will be described in detail with reference to the following drawings. The present invention is illustrated by way of example and not limitation in the accompanying figures.

DETAILED DESCRIPTION

The description and accompanying drawings are for purposes of illustration and are not to be used to construe the invention in a restrictive manner. In the following description, specific details are set forth in order to provide a thorough understanding of the invention. However, it will be apparent to one of ordinary skill in the art that the invention can be practiced without these specific details. In other instances, well-known processing steps, methods, materials, etc. have not been described in particular detail in order to avoid unnecessarily obscuring the invention.

Figure 1:
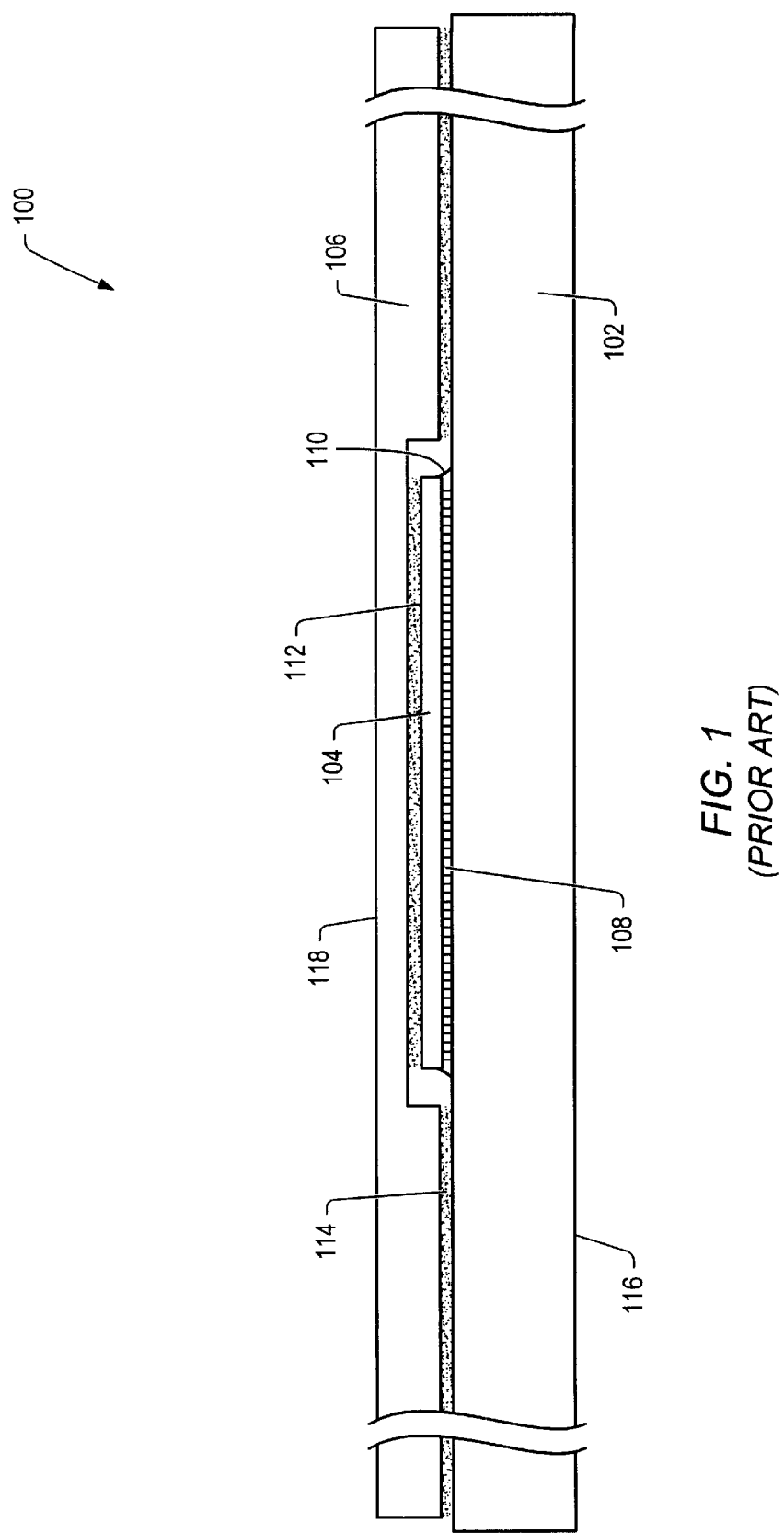
FIG. 1 illustrates a side view of a typical integrated circuit package.

FIG. 1 depicts a side view of a typical IC package 100. A die 104 is coupled to the top surface of a substrate 102 using conductive bumps 108. Die underfill 110 fills the gap between die 104 and substrate 102. A lid 106 is placed over die 104 and is coupled to die 104 using adhesive 112. Lid 106 is also coupled to substrate 102 using adhesive 114. Surface 116 of substrate 102 is the socket contact surface. Surface 118 of lid 106 is the heat sink contact surface.

Because the typical IC package 100 does not include any EMI containment features, the noise originating from die 104 is coupled to lid 106 and continues on to the heatsink (not shown) in contact with lid 106. Once the noise reaches the heatsink, it must be suppressed at the PCB level using a gasket, for example. Otherwise, the noise will couple unabated from the heatsink to neighboring components.

Figure 2A:
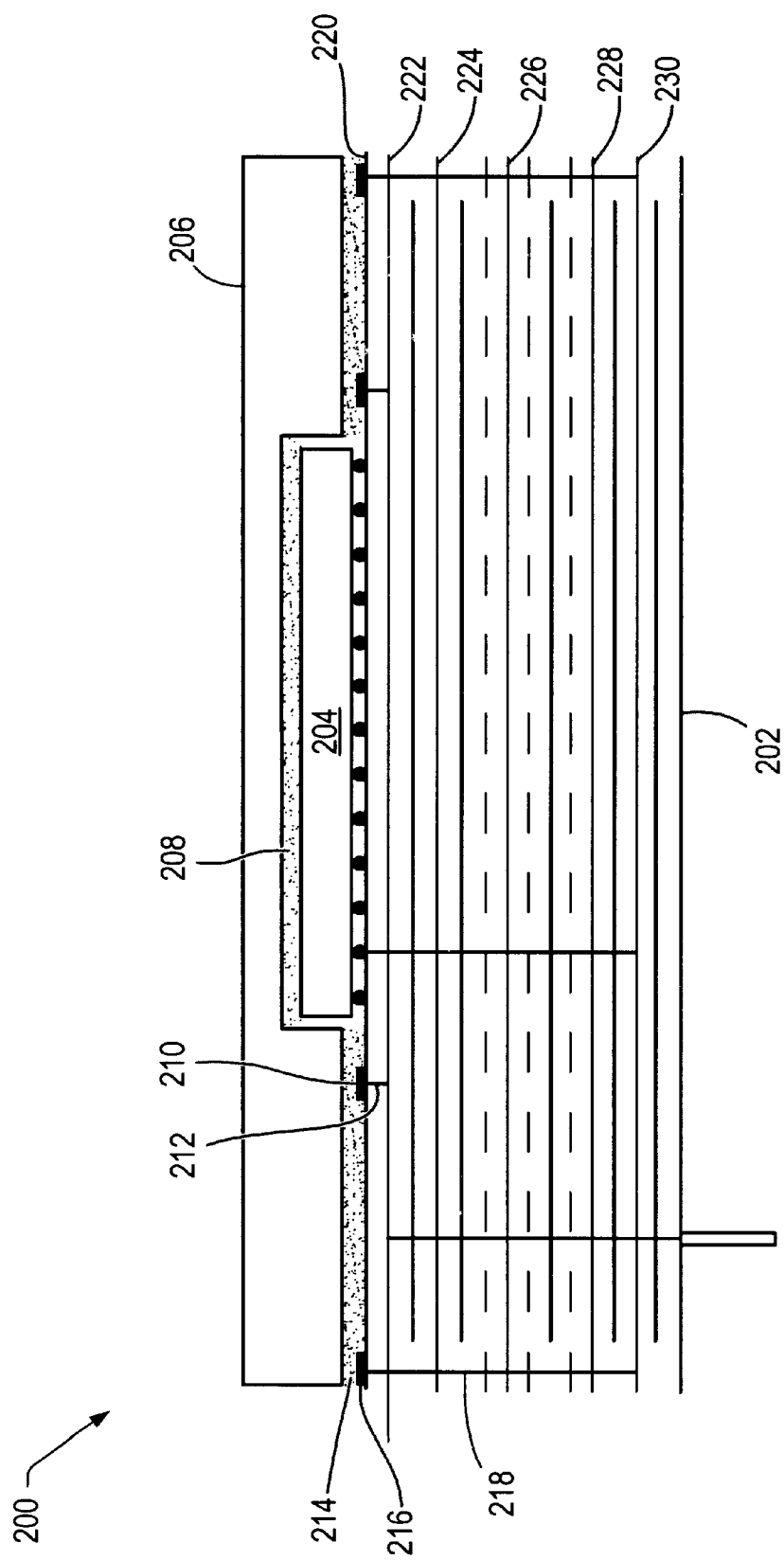
FIG. 2A illustrates a side view of an integrated circuit package in accordance with the teachings of the present invention.
Figure 2B:
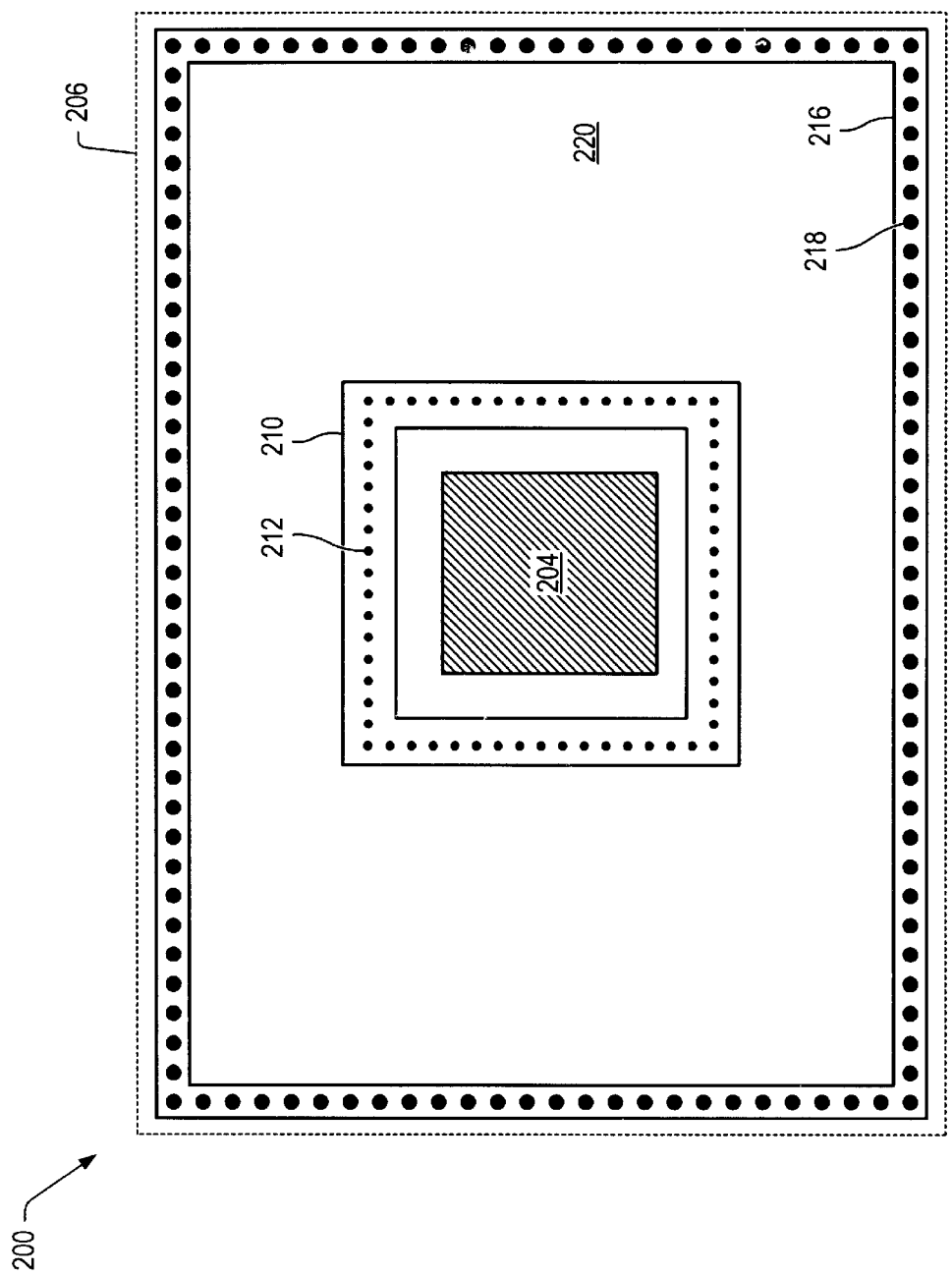
FIG. 2B illustrates a top view of the integrated circuit package of FIG. 2A.

FIG. 2A illustrates a side view of an IC package 200 having EMI containment features. FIG. 2B illustrates a top view of IC package 200. IC package 200 includes a substrate 202, a die 204 coupled to substrate 202, and a lid 206 placed over die 204 and substrate 202. Die underfill fills the gap between die 204 and substrate 202. Lid 206 is coupled to die 204 using an adhesive 208. Lid 206 is coupled to substrate 202 using an adhesive 214. Substrate 202 has a number of internal layers, such as power planes, ground planes and signal layers.

A conductive trace 210 is disposed around die 204 on a top surface 220 of substrate 202. Conductive trace 210 may be formed as part of the etching process used to prepare substrate 202. Buried vias 212 couple conductive trace 210 to a first ground plane 222. This creates a low impedance path from lid 206 to first ground plane 222, as lid 206 is coupled to substrate 202 using adhesive 214 which is a conductive epoxy in one embodiment. The conductive epoxy bridges a conductive path from lid 206 back to the IC package. Buried vias 212 are located along conductive trace 210 at regular intervals in one embodiment. Conductive trace 210 and buried vias 212 are part of a first EMI containment configuration of IC package 200. It is appreciated that vias 212 may be through vias in another embodiment.

Adhesive 208 is a conductive epoxy in one embodiment to facilitate the transfer of heat from die 204 to lid 206. In another embodiment, adhesive 208 is a nonconductive epoxy. Using a nonconductive epoxy may be appropriate for lower power chips because less heat is generated. If magnetic field effects are dominant, then using a nonconductive epoxy for adhesive 208 may also be appropriate because using a nonconductive epoxy between die 204 and lid 206 creates a higher impedance path from die 204 to lid 206. The noise source will essentially have a higher internal impedance thereby reducing the "current" flowing in the loop: from die 204 to adhesive 208 (nonconductive epoxy) to lid 206 to adhesive 214 (conductive epoxy) to trace 210 to ground plane 222 back to die 204.

A conductive trace 216 is disposed around conductive trace 210 on top surface 220 of substrate 202 near the periphery of IC package 200. Conductive trace 216 may be formed as part of the etching process used to prepare substrate 202. Vias 218 couple conductive trace 216 to each of the ground planes 222, 224, 226, 228, 230. It is appreciated that the number of ground planes between the first ground plane 222 and the last ground plane 230 may vary according to the particular IC. Conductive trace 216 and vias 218 are part of a second EMI containment configuration of IC package 200. The first and second EMI containment configurations may operate independently from each other.

The power planes within substrate 202 may be slightly recessed to facilitate the "stitching" together of the ground planes by vias 218. This package stitching creates a fence at the periphery of IC package 200 to help contain the noise generated by IC package 200. The package stitching may also be thought of as creating a cage, bounded by ground plane 222 and ground plane 230. Such a cage may help reduce the effects of the fringe field edge radiation, discussed below, by containing the generated noise.

The currents running through the vias within substrate 202 excite circular waves in the space between the internal layers of substrate 202, particularly between the power and ground planes. At the periphery of the internal structure of substrate 202, the circular waves create a fringe field which is radiated to the outside of IC package 200. The open space between adjacent internal layers of substrate 202 essentially acts as a slot antenna that further radiates the noise. The cage formed by the stitching of vias 218 helps prevent the noise from spreading outside IC package 200. With vias 218 in place, the length of the slot antenna is reduced to the distance between adjacent vias. A shorter length slot antenna is a good radiator of noise only at higher frequencies. Thus, the effectiveness of the cage is determined in part by the distance between adjacent vias 218. Closely spaced vias 218 create a more dense cage that can contain more of the fringe field radiation. In one embodiment, the distance between adjacent vias 218 is at most 100 mils.

In FIG. 2A, the first (top) internal layer of substrate 202 is ground plane 222 and the last (bottom) internal layer is a power plane. Although some of the internal layers of substrate 202 may not be enclosed by the cage formed by the package stitching, the noisiest planes, particularly the power/ground pairs, are enclosed. In another embodiment, the top and bottom internal layers of substrate 202 are both ground planes. Thus, in this embodiment, the package stitching forms a cage that encloses essentially the entire internal package structure and contains more of the fringe field radiation.

Vias 218 also provide low impedance paths in the same manner as vias 212. For example, the noise "current" may flow back to die 204 (instead of to a coupled heatsink) according to the following loop: from die 204 to adhesive 208 (nonconductive or conductive epoxy) to lid 206 to adhesive 214 (conductive epoxy) to trace 216 to ground plane 222 back to die 204. Additional loops exist with the other ground planes 224, 226, 228, 230. Thus, even if the fringe field radiation is not a dominant problem, the second EMI containment configuration formed in part by conductive trace 216 and vias 218 can still provide an additional level of EMI containment by providing additional low impedance paths. It is appreciated, however, that in this embodiment the lowest impedance path includes trace 210 and vias 212.

An EMI solution at the IC package level provides a built-in solution that may help reduce or even eliminate the need for downstream or add-on solutions. The dual EMI containment embodiment of the present invention may contain EMI closer to the source before it can be radiated or coupled away from the source.

In the foregoing detailed description, the present invention has been described with reference to specific exemplary embodiments. However, it will be evident that various modifications and changes may be made without departing from the broader scope and spirit of the present invention. The present specification and figures are accordingly to be regarded as illustrative rather than restrictive.

What is claimed is:

1. An apparatus comprising:
   an integrated circuit package comprising a substrate, a first EMI containment configuration, and a second EMI containment configuration disposed around said first EMI containment configuration, wherein said first EMI containment configuration is grounded by at least one ground plane of said substrate, and wherein said second EMI containment configuration is coupled to a plurality of grounding planes of said package.

2. The apparatus of claim 1, wherein said first EMI containment configuration is disposed around a die of said package.

3. The apparatus of claim 2, wherein said second EMI containment configuration is disposed along a periphery of said package.

4. The apparatus of claim 1, wherein said first and second EMI containment configurations comprise vias coupled to said at least one ground plane of said package.

5. The apparatus of claim 1, wherein said first and second EMI containment configurations comprise a conductive path to a lid of said package.

6. The apparatus of claim 1, wherein said first and second EMI containment configurations are independent from each other.

7. An integrated circuit package, comprising:
   a substrate comprising a plurality of vias, wherein each of said vias is coupleable on a top surface of said substrate;
   a die coupled to said top surface of said substrate;
   a lid disposed over said die and said substrate and coupled to said die and said substrate; and
   a first conductive ring disposed around said die;
   wherein said lid is coupled to said substrate by a conductive adhesive, said conductive adhesive coupling said vias and said lid to said first conductive ring;
   and wherein said substrate comprises a plurality of internal grounding planes, and wherein said grounding planes are coupled to one another by said vias.

8. The integrated circuit package of claim 7, wherein each of said vias is coupled to a second conductive ring on said top surface of said substrate.

9. The integrated circuit package of claim 8, wherein said second conductive ring surrounds said first conductive ring.

10. The integrated circuit package of claim 8, wherein said first and second conductive rings comprise traces.

11. The integrated circuit package of claim 7, wherein said first conductive ring is coupled to one of said internal ground planes by a plurality of vias.

12. The integrated circuit package of claim 7, wherein each of said vias is disposed adjacent another of said vias by a first distance.

13. The integrated circuit package of claim 12, wherein said first distance is at most 100 mils.

14. The integrated circuit package of claim 7, wherein said lid is coupled to said die by a non-conductive adhesive.

15. A method of containing EMI, comprising:

grounding a first EMI containment configuration around a die of an integrated circuit package disposed on a substrate;

grounding a second EMI containment configuration around said first EMI containment configuration, wherein grounding said second EMI containment configuration comprises coupling said second EMI containment configuration to a plurality of grounding planes of said substrate;

forming a conductive path between said first EMI containment configuration and a lid of said integrated circuit package;

forming a conductive path between said second EMI containment configuration and said lid of said lid of said integrated circuit package.

16. The method of claim 15, wherein grounding said first EMI containment configuration and grounding said second EMI containment configuration comprise coupling to at least one ground plane of said integrated circuit package.

17. The method of claim 15, wherein forming said conductive path between said first EMI containment configuration and said lid and forming said conductive path between said second EMI containment configuration and said lid comprise using a conductive adhesive.

18. The method of claim 15, wherein grounding said second EMI containment configuration comprises stitching an edge of said integrated circuit package with a plurality of vias coupled to a ground plane of said integrated circuit package.

* * * * *